(12) United States Patent
Park et al.

(10) Patent No.: US 10,310,050 B2
(45) Date of Patent: Jun. 4, 2019

(54) METHOD AND APPARATUS FOR CALCULATING OFFSET OF WHEATSTONE BRIDGE TYPE SENSOR

(71) Applicant: Korea Electronics Technology Institute, Seongnam-si, Gyeonggi-do (KR)

(72) Inventors: Won Ki Park, Suwon-si (KR); Dae Sung Lee, Yongin-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 0 days.

(21) Appl. No.: 15/702,578

(22) Filed: Sep. 12, 2017

(65) Prior Publication Data

US 2018/0180700 A1 Jun. 28, 2018

(30) Foreign Application Priority Data

Dec. 23, 2016 (KR) .................. 10-2016-0177483

(51) Int. Cl.
*G01R 35/00* (2006.01)
*G01R 17/10* (2006.01)
*G01R 33/07* (2006.01)

(52) U.S. Cl.
CPC ......... *G01R 35/005* (2013.01); *G01R 17/105* (2013.01); *G01R 33/07* (2013.01)

(58) Field of Classification Search
CPC ..... G01R 33/07; G01R 17/105; G01R 35/005
USPC ......... 324/245–252, 200, 207.21; 73/514.31, 73/514.39, 520.01, 779, 862.193, 73/862.333; 365/157–158, 170–173, 365/225.5

See application file for complete search history.

(56) References Cited

U.S. PATENT DOCUMENTS

2005/0194980 A1* 9/2005 Konig .................. G01D 3/036
324/610

FOREIGN PATENT DOCUMENTS

JP 2007-147575 6/2007
KR 10-2013-0026218 3/2013

OTHER PUBLICATIONS

Office Action received in Korean Patent Application No. 10-2016-0177483, dated Dec. 20, 2017.

* cited by examiner

*Primary Examiner* — Melissa J Koval
*Assistant Examiner* — Trung Nguyen
(74) *Attorney, Agent, or Firm* — Knobbe Martens Olson & Bear LLP

(57) ABSTRACT

A method and an apparatus for calculating an offset of a Wheatstone bridge type sensor are described. The offset calculation method includes measuring resistances between nodes of a Wheatstone bridge type sensor, calculating an offset of the sensor using the measured resistances and providing information on the calculated offset. Accordingly, the offset of the Wheatstone bridge type sensor can be rapidly and easily calculated independently from the size of a bias current, and ultimately. Furthermore, time required to measure can be reduced and thus a sensor fabrication cost can be reduced, and also, mass production can be enhanced.

3 Claims, 9 Drawing Sheets

$R_A = R_1 \| (R_2 + R_3 + R_4)$

|  | R12(KΩ) | R23(KΩ) | R34(KΩ) | R41(KΩ) |
|---|---|---|---|---|
| #2 | 5.369 | 5.353 | 5.384 | 5.347 |
|  | 0.41% | 0.11% | 0.69% | 0% |
| #3 | 9.72 | 9.738 | 9.566 | 9.526 |
|  | 2% | 2.22% | 0.41% | 0% |
| #4 | 11.23 | 11.307 | 11.63 | 11.29 |
|  | 0% | 0.68% | 1.15% | 0.53% |

FIG. 9

|  | R1(KΩ) | R2(KΩ) | R3(KΩ) | R4(KΩ) |
|---|---|---|---|---|
| #2 | 7.16 | 7.13 | 7.19 | 7.12 |
|  | 0.62% | 0.17% | 1.04% | 0% |
| #3 | 13.02 | 13.05 | 12.71 | 12.63 |
|  | 3.07% | 3.35% | 0.62% | 0% |
| #4 | 14.94 | 15.08 | 15.96 | 15.05 |
|  | 0% | 0.97% | 1.74% | 0.77% |

FIG. 10

○ Offset voltage is verified to occur by
  a difference in resistance values

- case 1: nodes 1 and 3=1 mA,
          voltages of nodes 2 and 4 measured (V24)
- case 2: nodes 2 and 4=1 mA,
          voltages of nodes 1 and 3 measured (V13)

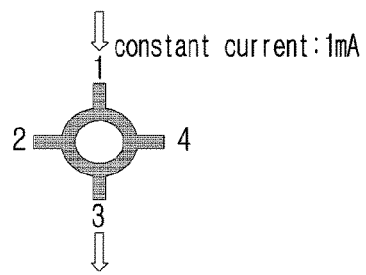

| | Measured values | | Calculated values after resistance values are measured | | Algorithm applied | |
|---|---|---|---|---|---|---|
| | V24 VOLTAGE (case1) | V13 VOLTAGE (case2) | V24 VOLTAGE (case1) | V13 VOLTAGE (case2) | V24 VOLTAGE (case1) | V13 VOLTAGE (case2) |
| #2 | 26 mV | 26.1 mV | 26.5 mV | 26.5 mV | 26.5 mV | 26.5 mV |
| #3 | 9 mV | 9 mV | 11 mV | 11 mV | 11 mV | 11 mV |
| #4 | 1 mV | 1 mV | 0.035 mV | 0.035 mV | 0.035 mV | 0.035 mV |

○ It is identified that measured offset voltage, calculated values
  through simultaneous equations, results of application
  of an algorithm are the same.

FIG. 11

METHOD AND APPARATUS FOR CALCULATING OFFSET OF WHEATSTONE BRIDGE TYPE SENSOR

CROSS-REFERENCE TO RELATED APPLICATION(S) AND CLAIM OF PRIORITY

The present application claims priority to and the benefit under 35 U.S.C. § 119(a) to Korean patent application filed in the Korean Intellectual Property Office on Dec. 23, 2016, and assigned Serial No. 10-2016-0177483, the entire disclosure of which is hereby incorporated by reference.

TECHNICAL FIELD

The present disclosure relates generally to a technique of calculating an offset of a sensor, and more particularly, to a method and a system for rapidly and exactly measuring an offset which is non-uniformity of a sensor occurring when the sensor is fabricated.

BACKGROUND

An offset of a sensor refers to a characteristic parameter which is caused by non-uniformity in a sensor fabrication process. That is, an offset of a sensor refers to a difference between an ideal output value and a real output value of the sensor when there is no input signal to the sensor.

FIG. 1 illustrates an operation method of a planar hall resistance (PHR) sensor which is one of the Wheatstone bridge type sensors. As shown in FIG. 1, the PHR sensor applies a bias current or voltage between two nodes (between node 1 and node 3 or between node 2 and node 4), and then measures a voltage proportional to an externally input magnetic field between the other nodes (between node 2 and node 4 or between node 1 and node 3).

An amplifier is connected to the PHR sensor as shown in FIG. 1, and an offset of the PHR sensor is calculated by applying only a bias current without applying an external magnetic field (an input magnetic field), and then measuring an output voltage.

FIG. 2 is a view showing four types of real PHR sensors. The PHR sensors illustrated in FIG. 2 may have different patterns of lines for adjusting a line length between nodes. Specifically, type #1 refers to a 1 ring type having a line formed directly between nodes, type #2 refers to a 5 ring type having lines bent between nodes in five times in a zigzag pattern, and type #3 refers to a 11 ring type having lines bent between nodes in 11 times in a zigzag pattern, and type #4 refers to a 17 ring type having lines bent between nodes in 17 times in a zigzag pattern.

FIG. 3 illustrates offset voltages which are measured after sampling 11 real PHR sensors of each type as shown in FIG. 2 and applying a bias current of 1 mA to the real PHR sensors. As shown in FIG. 2, since the offset voltages of the real PHR sensors are not uniform, there is inconvenience that offset voltages should be individually measured at every PHR sensor.

In addition, the offset voltage varies according to a bias current. Accordingly, when the bias current is changed, the offset voltage is also changed and thus the offset voltage should be displayed with the bias current.

SUMMARY

To address the above-discussed deficiencies of the prior art, it is a primary aspect of the present disclosure to provide a method and an apparatus for more rapidly and easily calculating an offset of a Whetstone bridge type sensor which is independent from the size of a bias current.

According to one aspect of the present disclosure, a method for calculating an offset of a sensor includes: measuring resistances between nodes of a Wheatstone bridge type sensor; calculating an offset of the sensor using the measured resistances; and providing information on the calculated offset.

The offset of the sensor may be an equation which expresses an offset voltage according to a bias current as an independent variable.

The equation may be an equation which expresses the offset voltage as a product of the bias current and a reference offset.

The reference offset may be expressed by resistance between nodes.

The reference offset may not include multiplication and division between inter-node resistances.

The reference offset may include addition and subtraction between inter-node resistances.

The reference offset may be $(R_A-R_B+R_C-R_D)/2$, where $R_A$, $R_B$, $R_C$, and $R_D$ are resistances between nodes arranged according to one direction order.

The providing may include providing information on at least one of a reference offset and an offset voltage corresponding to an inputted bias current.

The sensor may be a magnetic sensor or a current sensor.

According to another aspect of the present disclosure, an apparatus for calculating an offset of a sensor includes: a measurement unit configured to measure resistances between nodes of a Wheatstone bridge type sensor; a calculator configured to calculate an offset of a sensor using the measured resistances; and a provider configured to provide information on the calculated offset.

According to another aspect of the present disclosure, a method for calculating an offset of a sensor includes: calculating an offset of a sensor using resistances between nodes of a Wheatstone bridge type sensor; and providing information on the calculated offset.

According to another aspect of the present disclosure, an apparatus for calculating an offset of a sensor includes: a calculator configured to calculate an offset of a sensor using resistances between nodes of a Wheatstone bridge type sensor; and a provider configured to provide information on the calculated offset.

According to exemplary embodiments of the present disclosure described above, the offset of the Wheatstone bridge type sensor can be rapidly and easily calculated independently from the size of a bias current, and ultimately, time required to measure can be reduced and thus a sensor fabrication cost can be reduced, and also, mass production can be enhanced.

In addition, according to exemplary embodiments of the present disclosure, the offset can be measured without a bias current applying circuit and an amplifier, and an instrument needed to measure the offset can be simplified, and accordingly, cost reduction can be achieved.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 9 is view showing results of real measurement of RA, RB, RC, and RD and errors;

FIG. 10 is a view showing results of calculation of R1, R2, R3, and R4 based on the results of real measurement of FIG. 9, and errors; and FIG. 11 is a view provided to illustrate verified performance of the results of calculation of offset voltages according to an exemplary embodiment of the present disclosure.

DETAILED DESCRIPTION

Hereinafter, the present disclosure will be described in detail with reference to the accompanying drawings.

Figure 4:
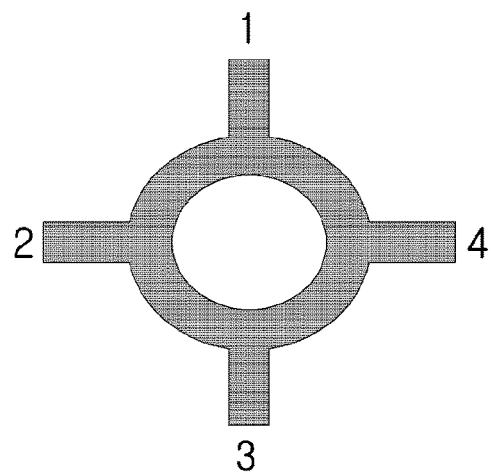
FIG. 4 is a view showing a model of the PHR sensor shown in FIG. 2.
Figure 5:
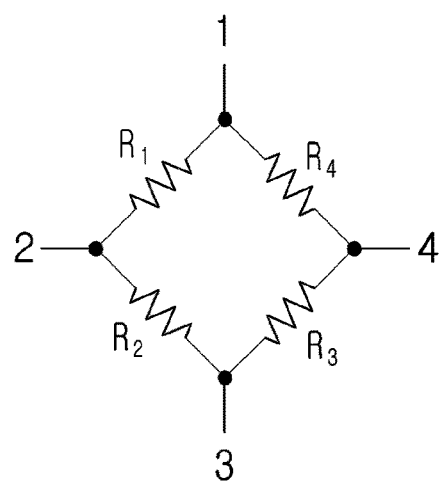
FIG. 5 is a view showing an equivalent circuit of the model shown in FIG. 4.

FIGS. 4 and 5 illustrate a planar hall resistance (PHR) sensor model, and an equivalent circuit, respectively. The PHR sensor is a kind of sensor for measuring magnetism and is of a Wheatstone bridge type.

The PHR sensor is formed in a ring type and has resistance values of resistances R1, R2, R4, and R4 changed according to a correlation between a direction of a current and a direction of an external magnetic field when a bias current is applied. In this case, variations in resistance values of diagonally opposite resistances are the same, whereas variations in resistance values of adjacent resistances are contrary to each other.

That is, as resistance values of resistances R1 and R3 increase, resistance values of resistances R2 and R4 decrease, and, as resistance values of resistances R2 and R4 increase, resistance values of resistances R1 and R3 decrease.

Figure 1:
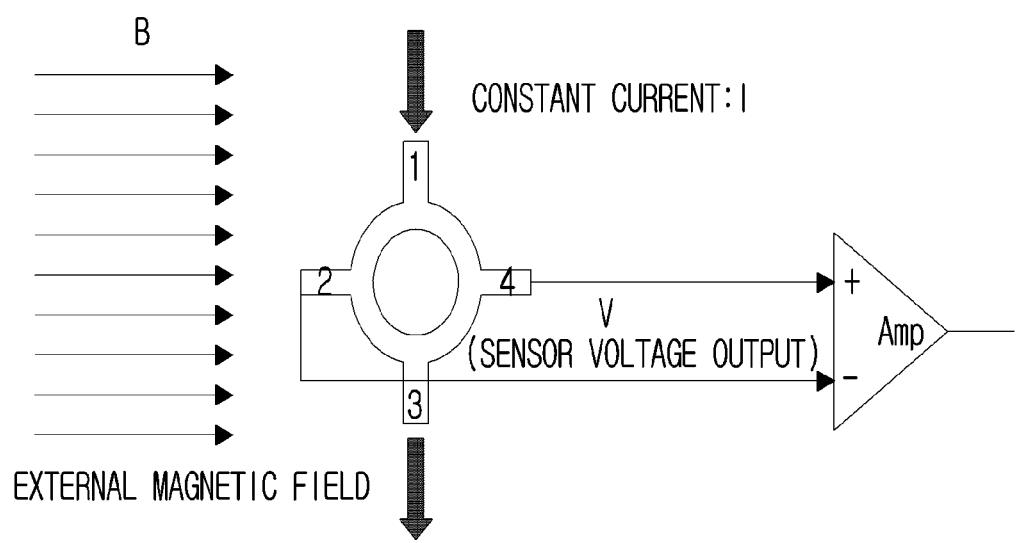
FIG. 1 is a view showing an operation method of a PHR sensor.

As described above, the PHR sensor increases resistance values of one pair of diagonally opposite resistances of the four resistances and decrease resistance values of the other pair of diagonally opposite resistances according to an external magnetic field (an input magnetic field), and outputs an intensity of a magnetic field as a voltage based on a difference between the resistance values (see FIG. 1).

When a bias current I flows, an offset voltage (Voffset) of the PHR sensor may be calculated based on the following equation:

$$Voffset=\{(R2*R4-R1*R3)/(R1+R2+R3+R4)\}*I \quad \text{Equation (1)}$$

According to the above-described equation, when $R2*R4$ equals $R1*R3$, the offset voltage is 0. That is, there is no offset when "$R2*R4=R1*R3$" although R1, R2, R3, and R4 are all not the same.

In addition, the sign (+/−) of the offset voltage may be determined according to a magnitude relation between $R2*R4$ and $R1*R3$. Specifically, when "$R2*R4>R1*R3$," the offset voltage is a positive (+) voltage, and, when "$R2*R4<R1*R3$," the offset voltage is a negative (−) voltage.

Figure 6:
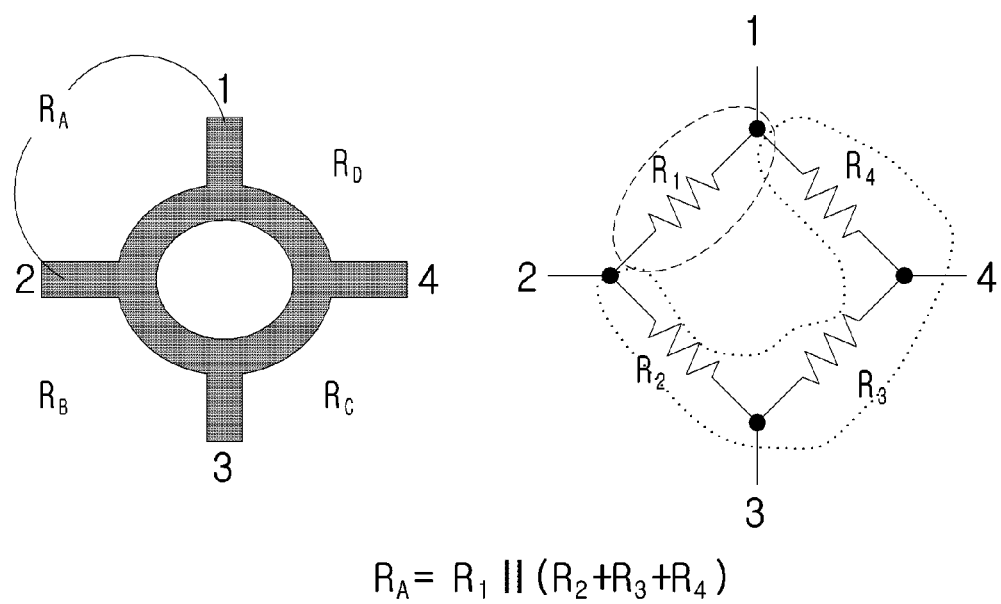
FIG. 6 is a view provided to explain resistance values between nodes.

As shown in FIG. 6, a resistance value RA (R12) measured between node 1 and node 2 is a parallel resistance of "R1" and "R2+R3+R4" rather than "R1". Likewise, a resistance value RB (R23) measured between node 2 and node 3 is a parallel resistance of "R2" and "R1+R3+R4," a resistance value RC (R34) measured between node 3 and node 4 is a parallel resistance of "R3" and "R1+R2+R4," and a resistance value RD (R41) measured between node 4 and node 1 is a parallel resistance of "R4" and "R1+R2+R3."

RA, RB, RC, and RD may be expressed by the following equations:

$$RA=R1\|(R2+R3+R4) \quad \text{Equation (2)}$$

$$RB=R2\|(R1+R3+R4) \quad \text{Equation (3)}$$

$$RC=R3\|(R1+R2+R4) \quad \text{Equation (4)}$$

$$RD=R4\|(R1+R2+R3) \quad \text{Equation (5)}$$

Since R1, R2, R3, and R4 are not really measured, RA, RB, RC, and RD, which are resistances between nodes, should be measured and then four simple simultaneous equations in four variables should be solved in order to obtain R1, R2, R3, and R4 values.

A difference between resistances of adjacent nodes may be calculated based on the above-described equations as follows:

$$RA-RB=(R1*R3+R1*R4-R2*R3-R2*R4)/(R1+R2+R3+R4) \quad \text{Equation (6)}$$

$$RB-RC=(R1*R2+R2*R4-R1*R3-R3*R4)/(R1+R2+R3+R4) \quad \text{Equation (7)}$$

$$RC-RD=(R1*R3+R2*R3-R1*R4-R2*R4)/(R1+R2+R3+R4) \quad \text{Equation (8)}$$

$$RD-RA=(R1*R4+R3*R4-R1*R2-R1*R3)/(R1+R2+R3+R4) \quad \text{Equation (9)}$$

In addition, when both sides of equations (6) and (8) are added and both sides of equations (7) and (9) are added, the following equations are obtained:

$$(6)+(8)=RA-RB+RC-RD=2(R2*R4-R1*R3)/(R1+R2+R3+R4) \quad \text{Equation (10)}$$

$$(7)+(9)=RC-RD+RD-RA=2(R1*R3-R2*R4)/(R1+R2+R3+R4) \quad \text{Equation (11)}$$

From equation (10) or (11), following equation (12) may be derived:

$$(R2*R4-R1*R3)/(R1+R2+R3+R4)=(RA-RB+RC-RD)/2 \quad \text{Equation (12)}$$

The left-hand side of equation (12) corresponds to a reference offset in equation (1) indicating an offset voltage of a PHR sensor. Accordingly, when the right-hand side of equation (12) is substituted for equation (1), the offset voltage of the PHR sensor in which a reference offset is expressed by RA, RB, RC, and RD rather than R1, R2, R3, and R4 may be obtained, which is expressed as follows:

$$V\text{offset}=\{(RA-RB+RC-RD)/2\}*I \quad \text{Equation (13)}$$

Much calculation and much time are required to calculate an offset voltage by obtaining R1, R2, R3, and R4 from RA, RB, RC, and RD.

However, using equation (13), the offset voltage of the PHR sensor may be calculated rapidly and easily without complicated calculation. As shown in equation (13), the size of the offset may be determined simply by calculating the reference offset (RA−RB+RC−RD)/2 with resistances between nodes.

Furthermore, since equation (13) provides the reference offset voltage which is independent from the bias current, that is, which has nothing to do with a change in the bias current, equation (13) has high availability.

Figure 7:
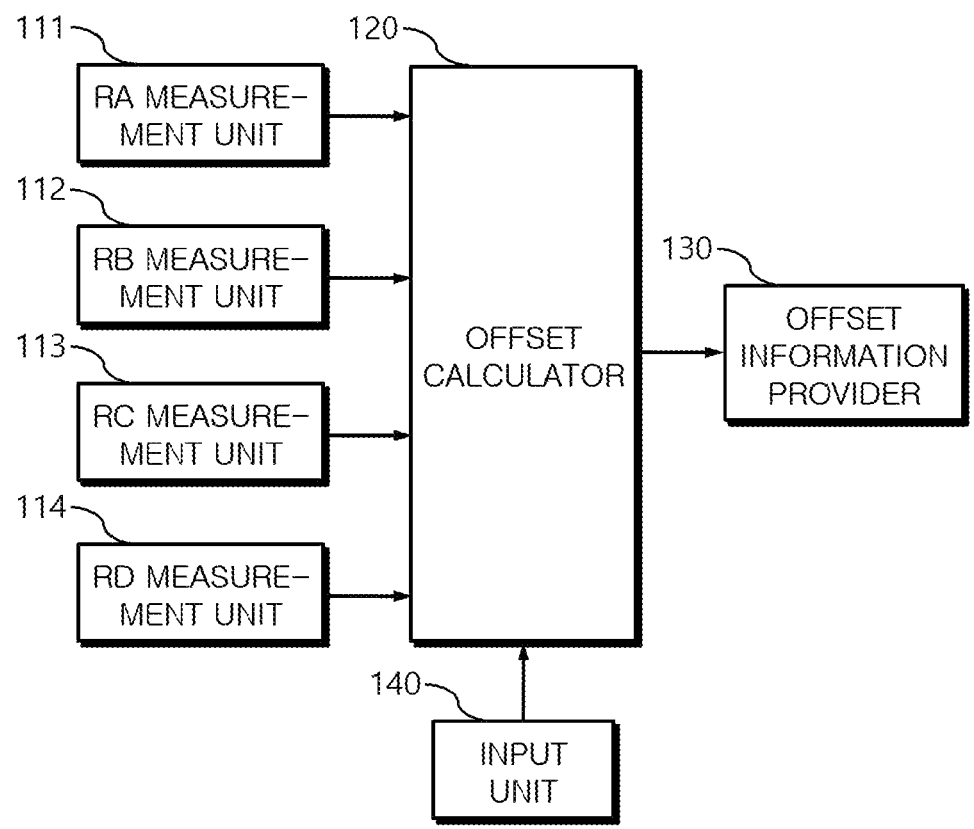
FIG. 7 is a block diagram showing an offset calculation apparatus according to an exemplary embodiment of the present disclosure.

An apparatus for calculating an offset voltage of a PHR sensor using equation (13) will be described in detail with reference to FIG. 7. FIG. 7 is a block diagram showing an offset calculation apparatus according to an exemplary embodiment of the present disclosure.

As shown in FIG. 7, the offset calculation apparatus according to an exemplary embodiment of the present disclosure includes an RA measurement unit 111, an RB measurement unit 112, an RC measurement unit 113, an RD measurement unit 114, an offset calculator 120, an offset information provider 130, and an input unit 140.

The RA measurement unit 111, the RB measurement unit 112, the RC measurement unit 113, and the RD measurement unit 114 are resistance measurement devices which measure RA, RB, RC, and RD values of the PHR sensor, respectively. The RA, RB, RC, and RD measured by the measurement units 111-114 are transmitted to the offset calculator 120.

The offset calculator 120 calculates a reference offset (RA−RB+RC−RD)/2 according to above-described equation (13). When a user inputs information (I) on a bias current value through the input unit 140, the offset calculator 120 may calculate an offset voltage [Voffset={(RA−RB+RC−RD)/2}*I] of the PHR sensor.

The offset information provider 130 is a display which visually outputs the reference offset and the offset voltage calculated by the offset calculator 120, and may be implemented by using a liquid crystal display (LCD), a 7-segment, or the like.

Furthermore, the offset information provider 130 and the input unit 140 may be integrated into a touch screen.

Figure 8:
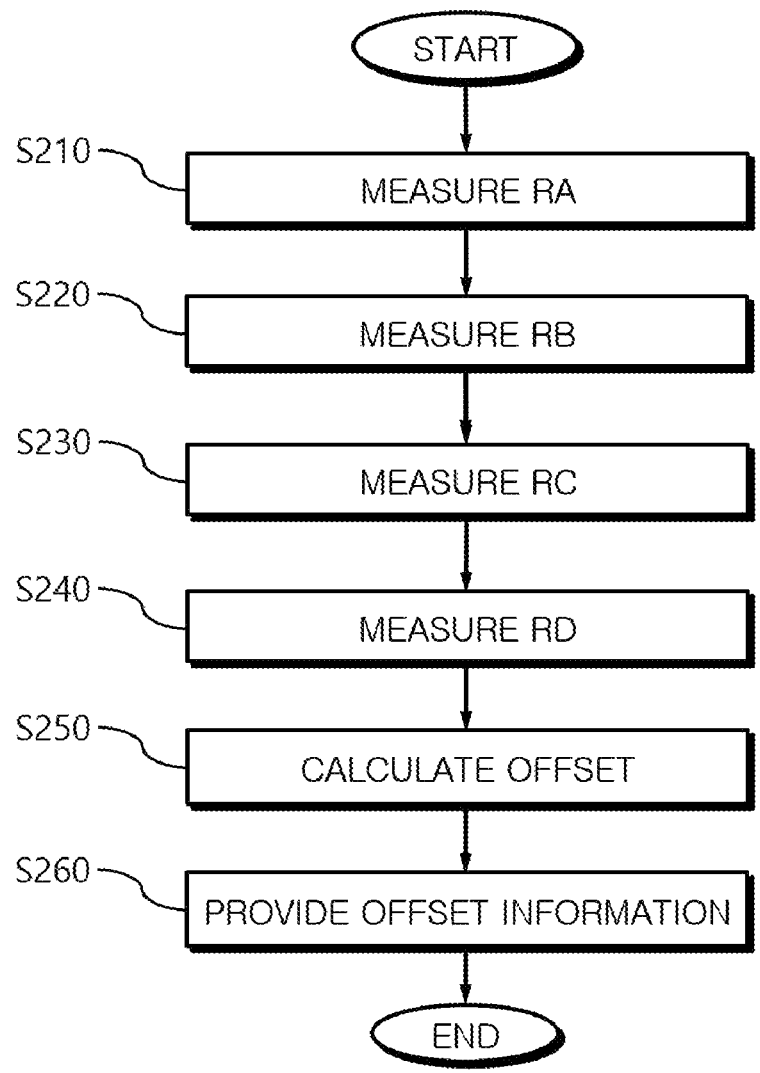
FIG. 8 is a flowchart provided to explain an offset calculation method according to an exemplary embodiment of the present disclosure.

An offset calculation process performed by the offset calculation apparatus shown in FIG. 7 will be described in detail with reference to FIG. 8. FIG. 8 is a flowchart showing an offset calculation method according to an exemplary embodiment of the present disclosure.

As shown in FIG. 8, when the PHR sensor is mounted in the offset calculation apparatus, the RA measurement unit 111 measures the RA value of the PHR sensor (S210), the RB measurement unit 112 measures the RB value of the PHR sensor (S220), the RC measurement unit 113 may measure the RC value of the PHR sensor (S230), and the RD measurement unit 112 measures the RD value of the PHR sensor (S240).

Then, the offset calculator 120 calculates a reference offset and an offset voltage using the results of measurement in steps S210 to S240 (S250).

In addition, the offset information provider 130 displays the offset information calculated in step S250 and provides the same to the user (S260).

Figure 2:
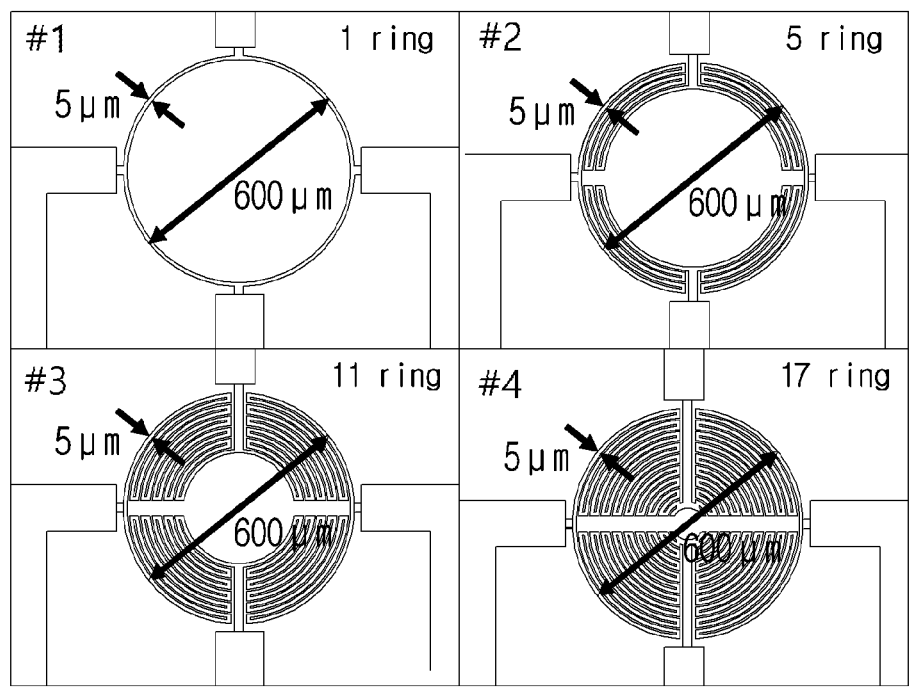
FIG. 2 is a view showing four types of real PHR sensors.

FIG. 9 illustrates a minimum value of real measurements RA (R12), RB (R23), RC (R34), and RD (R41) regarding sensor types #2, #3, and #4 shown in FIG. 2, and an error rate which is calculated with reference to the minimum value, and FIG. 10 illustrates results of calculation of R1, R2, R3, and R4 based on the results of real measurement of FIG. 9, and errors.

As described above, in deriving the results of calculation shown in FIG. 10, much calculation and much time are required.

Figure 3:
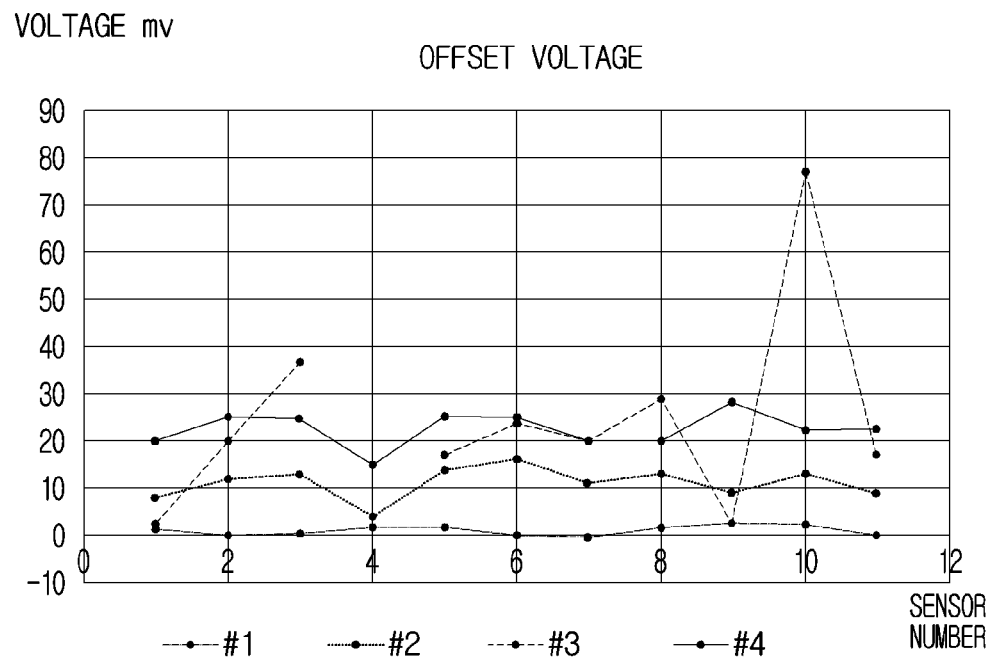
FIG. 3 is a view showing results of measurement of offset voltages in real PHR sensors shown in FIG. 2.

In table of FIG. 11, 1) "measured values" indicate results of real measurement of offset voltages after a bias current is applied according to a related-art method, 2) "calculated values after resistance values are measured" indicate results of calculation of offset voltages using R1, R2, R3, and R4 suggested in FIG. 10, and 3) "algorithm applied" indicates results of calculation of offset voltages using RA (R12), RB (R23), RC (R34), and RD (R41) suggested in FIG. 9 according to an exemplary embodiment of the present disclosure.

As shown in FIG. 11, it can be seen that the results of calculation of offset voltages according to an exemplary embodiment of the present disclosure are not greatly different from the results of real measurement or calculation of offset voltages using other methods.

The method and the apparatus for calculating the offset voltage of the PHR sensor have been described by referring to preferred embodiments.

The PHR sensor mentioned in the above-described embodiments is a kind of a magnetic sensor or a current sensor having a Wheatstone bridge type, and is merely an example. The technical idea of the present disclosure can be applied to other types of sensors having the Wheatstone bridge type.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus for a planar hall resistance (PHR) sensor comprising a first node, a second node, a third node and a fourth node arranged in order, the apparatus comprising:
    a first measurement unit configured to measure a first resistance between the first node and the second node when the PHR sensor is mounted in the apparatus;
    a second measurement unit configured to measure a second resistance between the second node and the third node when the PHR sensor is mounted in the apparatus;
    a third measurement unit configured to measure a third resistance between the third node and the fourth node when the PHR sensor is mounted in the apparatus;

a fourth measurement unit configured to measure a fourth resistance between the fourth node and the first node when the PHR sensor is mounted in the apparatus;

a reference offset calculator connected to the first, second, third and fourth measurement units and configured to apply the first, second, third and fourth resistances to a predetermined formula to calculate a reference offset of the PHR sensor, the reference offset being a value independent from a bias current of the PHP sensor;

a display connected to the reference offset calculator and configured to display the reference offset; and an input device connected to the reference offset calculator configured to receive a user input of a first bias current, wherein, in response to the user input, the reference offset calculator is further configured to compute a first offset for the PHR sensor based on the reference offset and the first bias current and wherein the display is further configured to display the first offset.

2. The apparatus of claim 1, wherein the reference offset calculator is further configured to multiply the reference offset and the first bias current to compute the first offset.

3. The apparatus of claim 1, wherein the reference offset calculator is configured to compute the reference offset based on the following relationship: $(RA-RB+RC-RD)/2$, where RA is the first resistance, RB is the second resistance, RC is the third resistance and RD is the fourth resistance.

* * * * *